(12) United States Patent
Kawabata et al.

(10) Patent No.: US 8,372,487 B2
(45) Date of Patent: Feb. 12, 2013

(54) CARBON NANOTUBE DEVICE AND MANUFACTURING METHOD OF THE SAME

(75) Inventors: Akio Kawabata, Kawasaki (JP); Mizuhisa Nihei, Kawasaki (JP); Daiyu Kondo, Kawasaki (JP); Shintaro Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 861 days.

(21) Appl. No.: 12/457,230

(22) Filed: Jun. 4, 2009

(65) Prior Publication Data
US 2009/0291216 A1  Nov. 26, 2009

Related U.S. Application Data

(62) Division of application No. 11/191,941, filed on Jul. 29, 2005, now abandoned.

(30) Foreign Application Priority Data

Mar. 18, 2005 (JP) ................................ 2005-080519

(51) Int. Cl.
*C01B 31/00* (2006.01)
*D01F 9/12* (2006.01)
(52) U.S. Cl. .................... 427/402; 977/742; 977/745
(58) Field of Classification Search .............. 423/445 R, 423/445 B; 977/742–752; 427/402
See application file for complete search history.

(56) References Cited

U.S. PATENT DOCUMENTS

| | | | | |
|---|---|---|---|---|
| 6,339,281 | B2 | 1/2002 | Lee et al. | 313/309 |
| 6,445,006 | B1 | 9/2002 | Brandes et al. | 257/76 |
| 7,019,391 | B2 | 3/2006 | Tran | 257/678 |
| 7,161,286 | B2 * | 1/2007 | Liu et al. | 313/311 |

FOREIGN PATENT DOCUMENTS

| | | |
|---|---|---|
| JP | 2004-174637 | 6/2004 |
| JP | 2004-181620 | 7/2004 |

OTHER PUBLICATIONS

Japanese Office Action dated Mar. 17, 2009 (with Summary in English).

* cited by examiner

*Primary Examiner* — William Phillip Fletcher, III
(74) *Attorney, Agent, or Firm* — Kratz, Quintos & Hanson, LLP

(57) ABSTRACT

After forming an opening, a resist film is formed on the entire surface and a resist pattern is formed by patterning the resist film. The shape of the resist pattern is such that it covers one side of the bottom of the opening. As a result, a Si substrate is exposed only in one part of the opening. Then, using the resist pattern as a mask, a catalytic layer is formed on the bottom of the opening. Then, the resist pattern is removed. Carbon nanotubes are grown on the catalytic layer. At this time, since the catalytic layer is formed on only one side of the bottom of the opening, the Van der Waals force biased towards that side works horizontally on the growing carbon nanotubes. Therefore, the carbon nanotubes are attracted towards the nearest side of the $SiO_2$ film and grow biased towards that side.

8 Claims, 13 Drawing Sheets

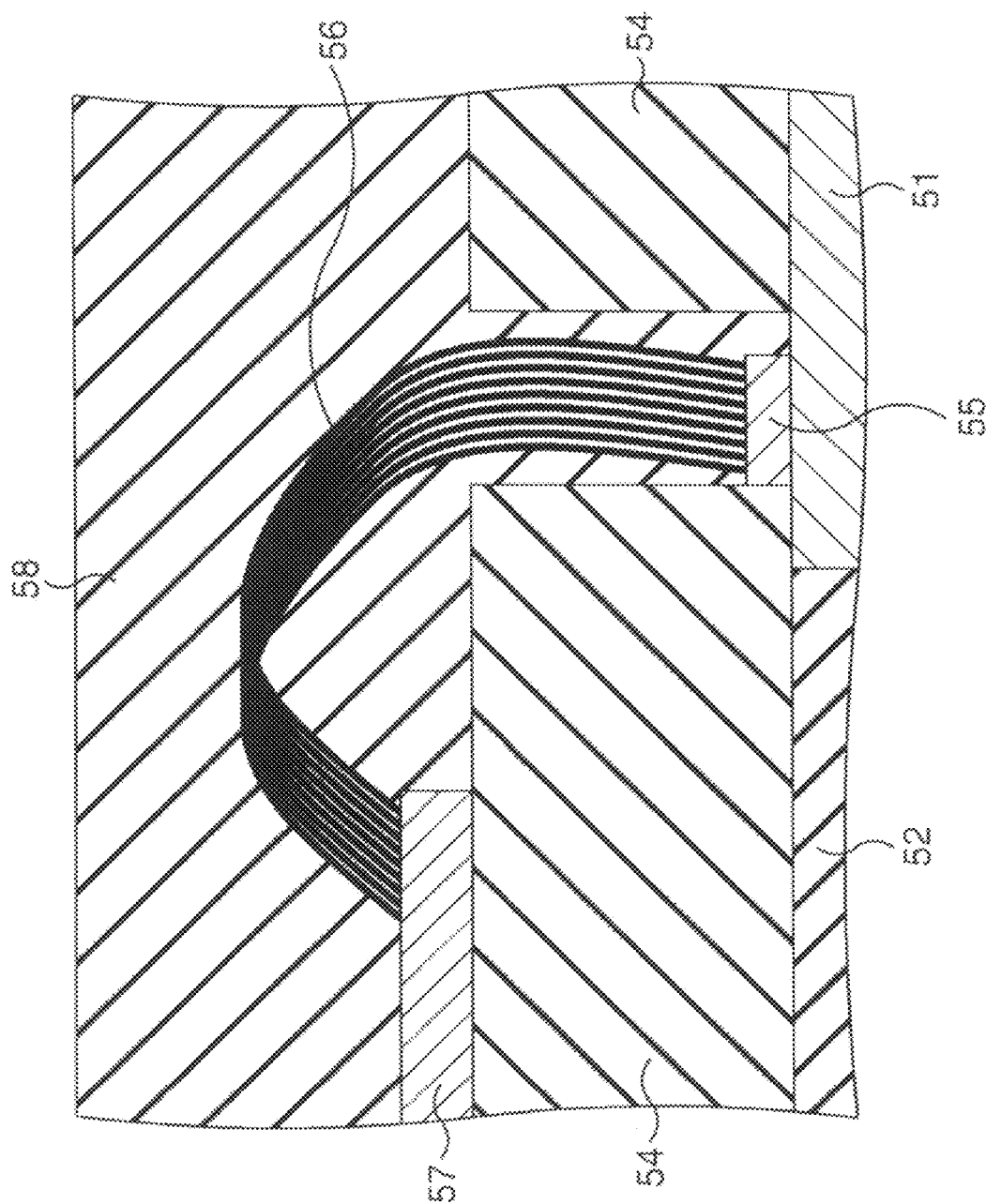

CARBON NANOTUBE DEVICE AND MANUFACTURING METHOD OF THE SAME

CROSS-REFERENCE TO RELATED APPLICATIONS

This application is a Divisional Application of prior application Ser. No. 11/191,941 filed on Jul. 29, 2005 now abandoned. This application is based upon and claims the benefit of priority from the prior Japanese Patent Application No. 2005-080519, filed on Mar. 18, 2005, the entire contents of which are incorporated herein by reference.

BACKGROUND OF THE INVENTION

1. Field of the Invention

The present invention relates to a carbon nanotube device suitable for integrated circuits and the like and a manufacturing method of the same.

2. Description of the Related Art

In recent years, many researches have been directed to application of a carbon nanotube to semiconductor devices. As a method of obtaining a carbon nanotube, a catalytic layer is arranged in a hole formed in an insulating film, and the carbon nanotubes are grown vertically from the catalytic layer as shown in FIG. 11A, FIG. 11B, FIG. 12A and FIG. 12B.

In addition to the above method, there is a method of growing a carbon nanotube in a horizontal direction. This method will be explained. FIG. 13 is a view showing a method of growing the carbon nanotube horizontally. A laminate of a titanium (Ti) film 102 and a cobalt (Co) film 103 is formed at two spots on a silicon (Si) substrate 101 in advance. An electric field is applied between these two spots to grow a carbon nanotube 104. As a result, as shown in FIG. 13, the carbon nanotubes 104 running along the direction of the electric field applied thereto are formed.

However, there is a limitation in shape of the carbon nanotube formed according to these methods only. Furthermore, under a circumstance where no electric field is applied, it is impossible to connect between two spots existing apart from each other horizontally by the carbon nanotubes.

Related arts are disclosed in Japanese Patent Application Laid-open No. 2004-181620 (Patent Document 1), and Japanese Patent Application Laid-open No. 2004-174637 (Patent Document 2).

SUMMARY OF THE INVENTION

The present invention is made in view of the aforementioned problems, and its object is to provide a carbon nanotube device having a high degree of freedom in the shape of the carbon nanotube and a manufacturing method of the same.

As a result of earnest studies to solve the above-described problems, the present inventors have arrived at several aspects of the present invention as shown below.

A carbon nanotube device according to the present invention includes a catalytic layer, a body positioned around the catalytic layer, and a carbon nanotube grown along the body from the catalytic layer. The carbon nanotube is curved at a corner of the body.

In a manufacturing method of the carbon nanotube according to the present invention, after a catalytic layer and a body extending to a position above the catalytic layer around the catalytic layer are formed, a carbon nanotube is grown from the catalytic layer along the body while being bent by the effect of the Van der Waals force from the body.

BRIEF DESCRIPTION OF THE DRAWINGS

FIG. 10 is a sectional view showing a carbon nanotube device according to a fourth embodiment of the present invention;

DETAILED DESCRIPTION OF THE PREFERRED EMBODIMENTS

Hereinafter, embodiments of the present invention will be concretely explained with reference to attached drawings. However, for convenience' sake, the structure of a carbon nanotube device will be explained when the manufacturing method of the same is explained.

First Embodiment

Figure 1A:
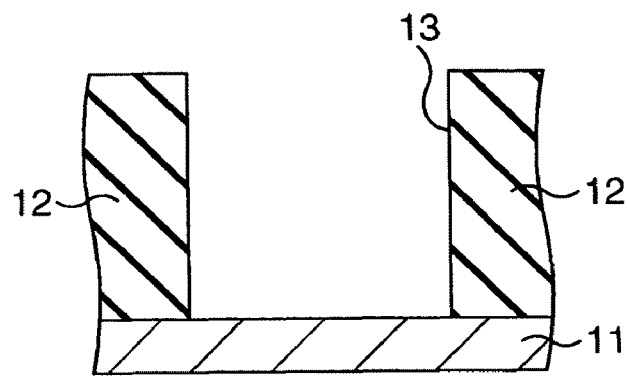
FIG. 1A to FIG. 1C are sectional views showing a manufacturing method of a carbon nanotube device according to a first embodiment of the present invention in process order.
Figure 1B:
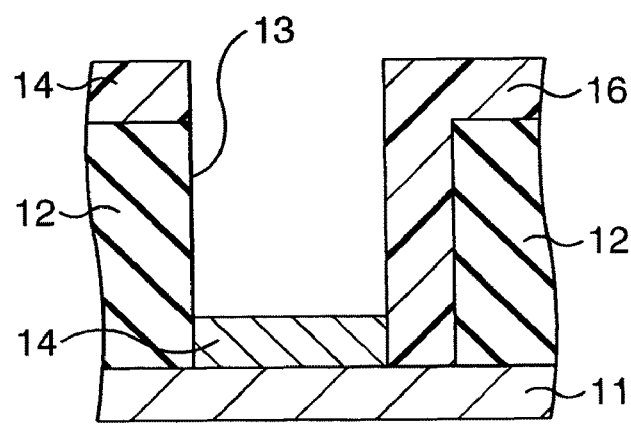
Figure 1C:
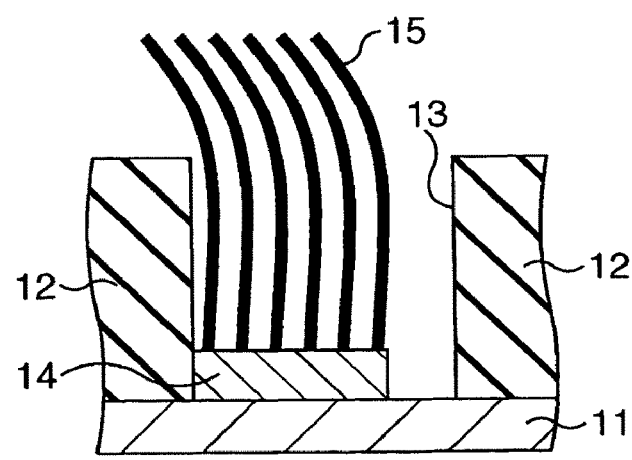

Firstly, a first embodiment of the present invention will be explained. FIG. 1A to FIG. 1C are sectional views showing a manufacturing method of a carbon nanotube device according to the first embodiment of the present invention in process order.

In the first embodiment, as shown in FIG. 1A, a SiO$_2$ film 12 is first formed on a silicon (Si) substrate 11. The SiO$_2$ film 12 is, for instance, about 350 nm in thickness. Next, a cylindrical opening 13 is formed in the SiO$_2$ film 12 by patterning with a resist pattern (not shown). The opening 13 is, for instance, about 2 μm in diameter.

Then, a resist film is formed on the entire surface, and a resist pattern 16 is formed by patterning the resist film, as shown in FIG. 1B. The resist pattern 16 has a shape covering the bottom of the opening 13 on only one side. As a result, the Si substrate 11 is exposed only from a part of the opening 13. In the present embodiment, especially when the resist pattern 16 is formed, a part of a side surface of the SiO$_2$ film 12 is exposed without being covered by the resist pattern 16.

Then, as shown also in FIG. 1B, using the resist pattern 16 as a mask, a catalytic layer 14 is formed on the bottom of the opening 13. A cobalt (Co) film of, for instance, about 1 nm in thickness, is formed as the catalytic layer 14. At this time, the catalytic layer 14 is not formed over the entire bottom of the opening 13 but only on the exposed part of the Si substrate 11.

Next, as shown in FIG. 1C, the resist pattern 16 is removed. Then, carbon nanotubes 15 are grown on the catalytic layer 14. At this time, since the catalytic layer 14 is formed biased towards one side in the opening 13, the Van der Waals force biased towards that side works horizontally on the carbon nanotubes 15 in the growing process. Therefore, as shown in FIG. 1C, the carbon nanotubes 15 are attracted towards the nearest side surface of the SiO$_2$ film 12 and grows biased towards that side. After they grow higher than the surface of the SiO$_2$ film 12, the Van der Waals force nearly ceases to have effect. However, the inclination is succeeded as is. During further growth, the carbon nanotubes 15 are largely affected by their own weight, so that their shape are significantly curved.

Figure 2A:
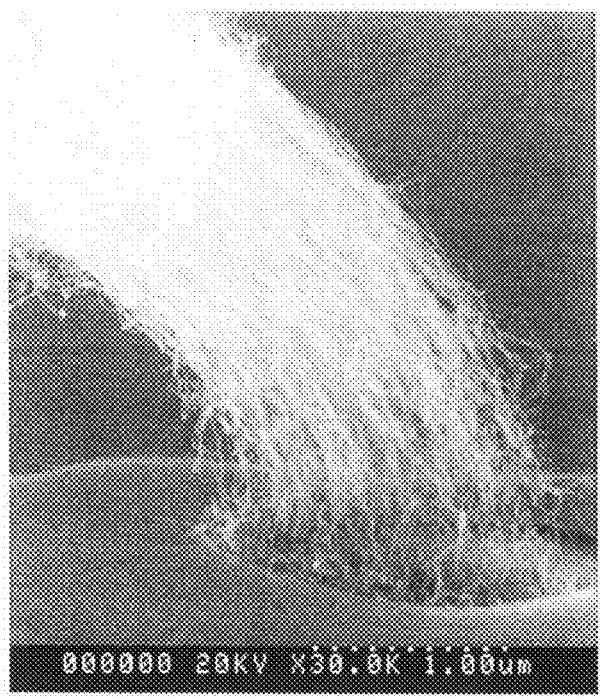
FIG. 2A is an SEM photograph showing carbon nanotubes grown from an opening.
Figure 2B:
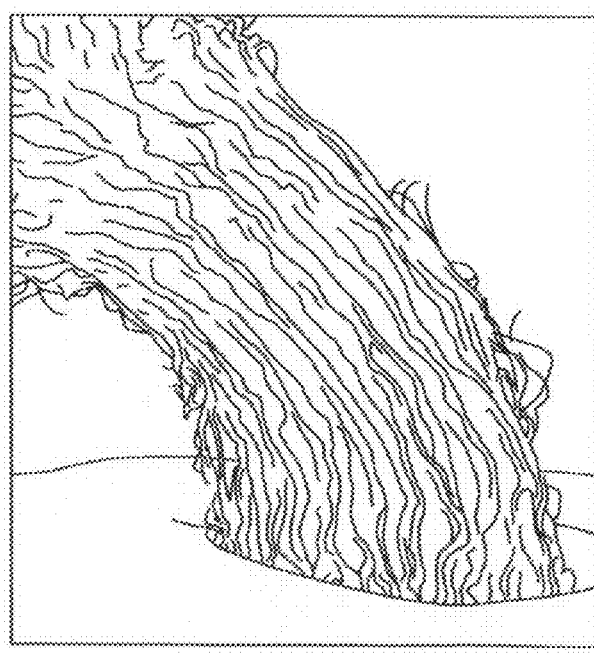
FIG. 2B is a schematic view showing the contents of the SEM photograph shown in FIG. 2A.
Figure 3A:
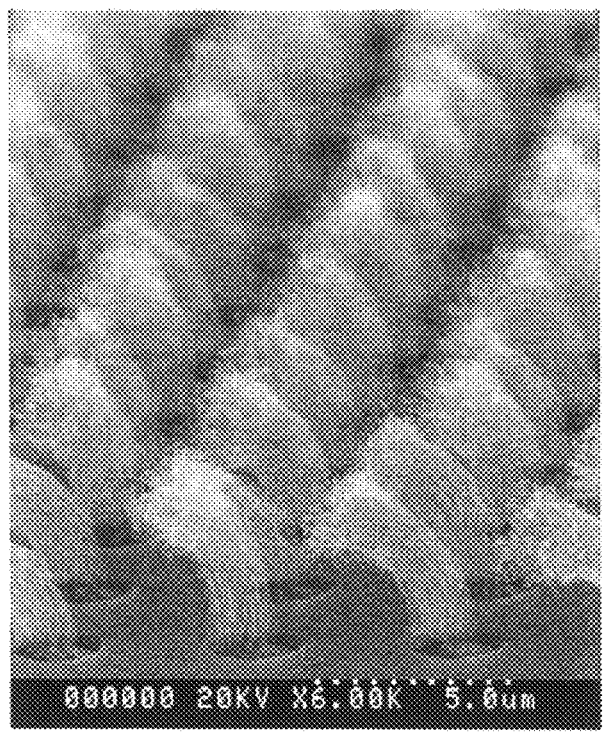
FIG. 3A is an SEM photograph showing carbon nanotubes grown from a plurality of openings.
Figure 3B:
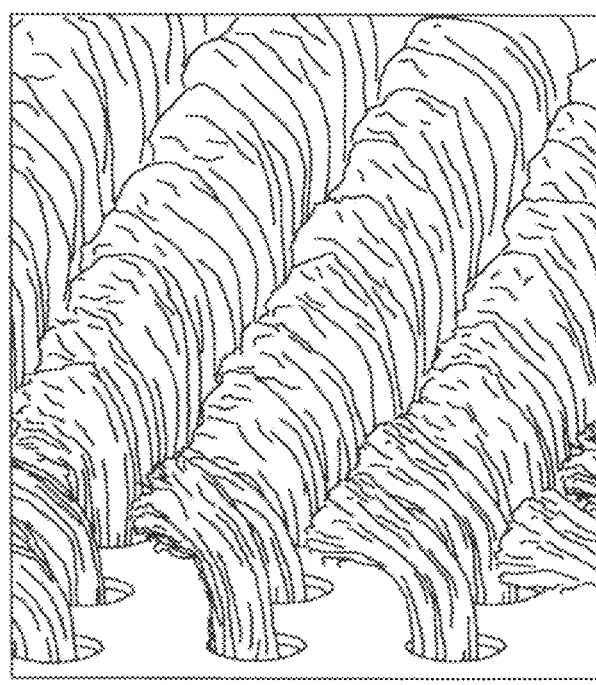
FIG. 3B is a schematic view showing the contents of the SEM photograph shown in FIG. 3A.

The SEM photographs of the carbon nanotubes actually taken by the present inventors are shown in FIG. 2A and FIG. 3A. FIG. 2A is an SEM photograph showing carbon nanotubes grown from an opening, and FIG. 2B is a schematic view showing the contents of the SEM photograph shown in FIG. 2A. FIG. 3A is an SEM photograph showing carbon nanotubes grown from a plurality of openings, and FIG. 3B is a schematic view showing the contents of the SEM photograph shown in FIG. 3A.

After the carbon nanotubes 15 are formed as described above, required elements, wiring layers, insulating layers and the like are formed to complete a carbon nanotube device.

According to the first embodiment, the carbon nanotubes 15 can be substantially grown in a direction parallel to the surface of the Si substrate 11 even without application of an electric field. In addition, since the carbon nanotubes 15 take a curved shape, the carbon nanotubes can be used extensively. For instance, a coil can be formed by connecting a plurality of curved carbon nanotubes 15 to each other.

Second Embodiment

Figure 4A:
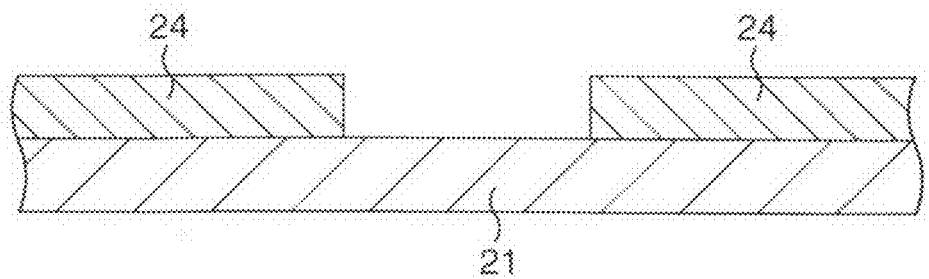
FIG. 4A to FIG. 4C are sectional views showing a manufacturing method of a carbon nanotube device according to a second embodiment of the present invention in process order.
Figure 4B:
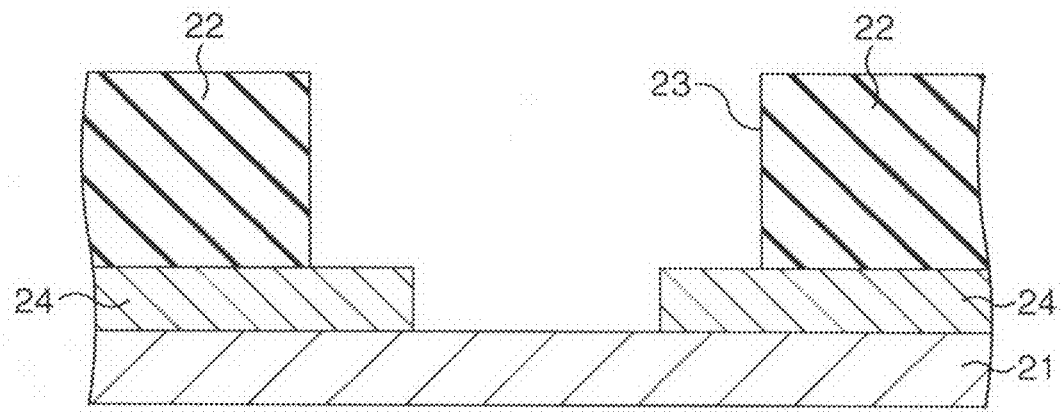
Figure 4C:
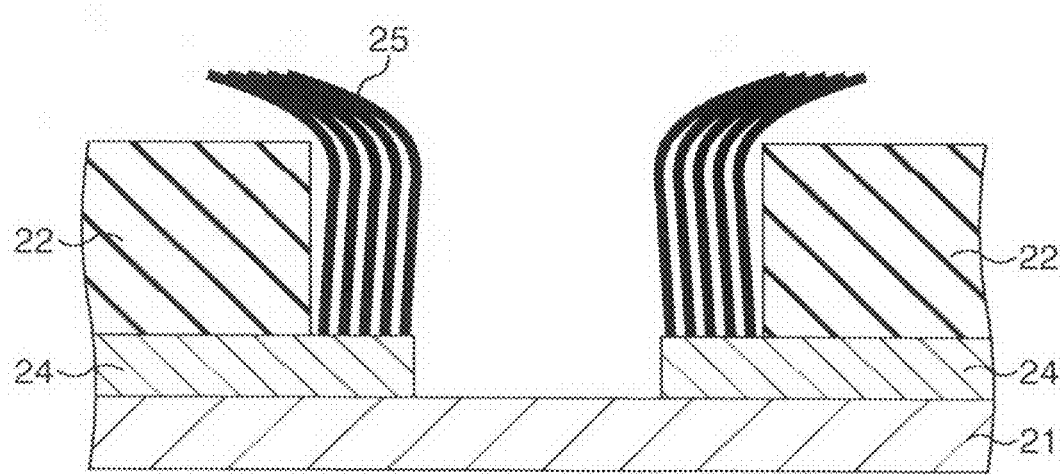

Next, a second embodiment of the present invention will be explained next. FIG. 4A to FIG. 4C are sectional views showing a manufacturing method of a carbon nanotube device according to the second embodiment of the present invention in process order.

First, in the second embodiment, as shown in FIG. 4A, a catalytic layer 24 is selectively formed on a Si substrate 21. As the catalytic layer 24, for instance, a cobalt (Co) film having a thickness of about 1 nm is formed.

Next, a SiO$_2$ film 22 is formed over the entire surface thereof. Then, a groove 23 is formed in the SiO$_2$ film 22 by patterning using a resist pattern (not shown). The thickness of the SiO$_2$ film 22 is, for instance, about 350 nm. When forming the groove 23, as shown in FIG. 4B, both of the Si substrate 21 and the catalytic layer 24 are to be exposed from the groove 23.

Thereafter, as shown in FIG. 4C, carbon nanotubes 25 are grown on the catalytic layer 24. At this time, since the catalytic layer 24 is not formed evenly on the entire bottom portion of the groove 23, but formed biased towards one side in the present embodiment, the Van der Waals force biased towards that side works horizontally on the carbon nanotubes 25 in the growing process. Accordingly, as shown in FIG. 4C, the carbon nanotubes 25 are attracted to a nearest side surface of the SiO$_2$ film 22 and grow biasedly. After they grow higher than the surface of the SiO$_2$ film 22, the Van der Waals force scarcely works, but the inclination is succeeded as it is. When they further grow, a large own weight works on the carbon nanotubes 25, so that the shape of the carbon nanotubes 25 are largely curved.

Figure 5A:
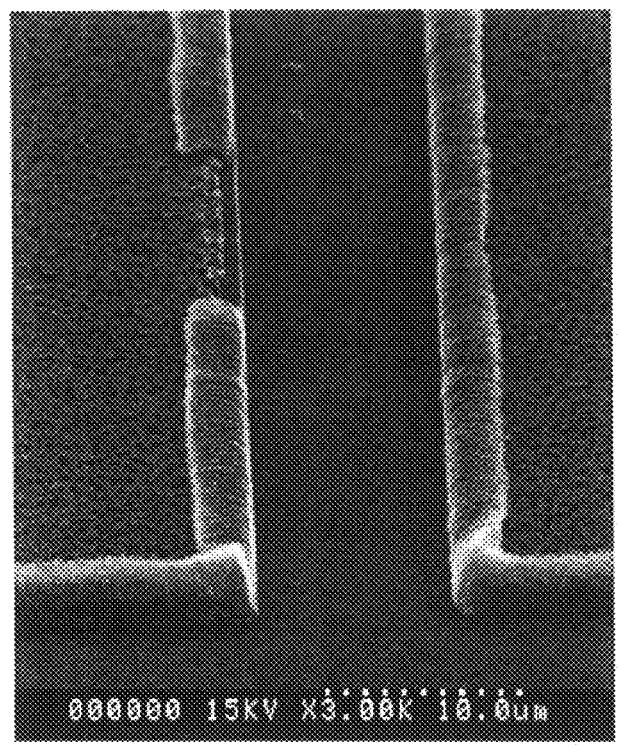
FIG. 5A is an SEM photograph showing carbon nanotubes grown from a T-shaped groove in plane view.
Figure 5B:
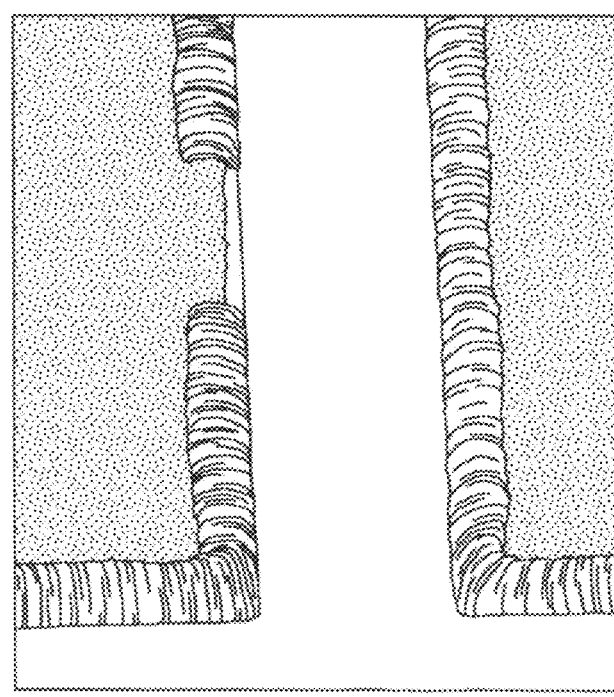
FIG. 5B is a schematic view showing the contents of the SEM photograph shown in FIG. 5A
Figure 6A:
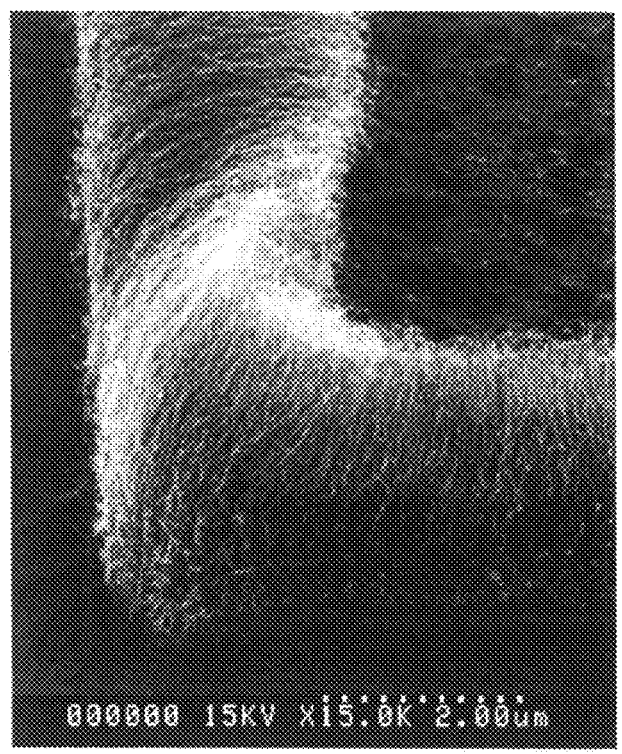
FIG. 6A is an SEM photograph enlargedly showing a bent portion on the right side of FIG. 5A.
Figure 6B:
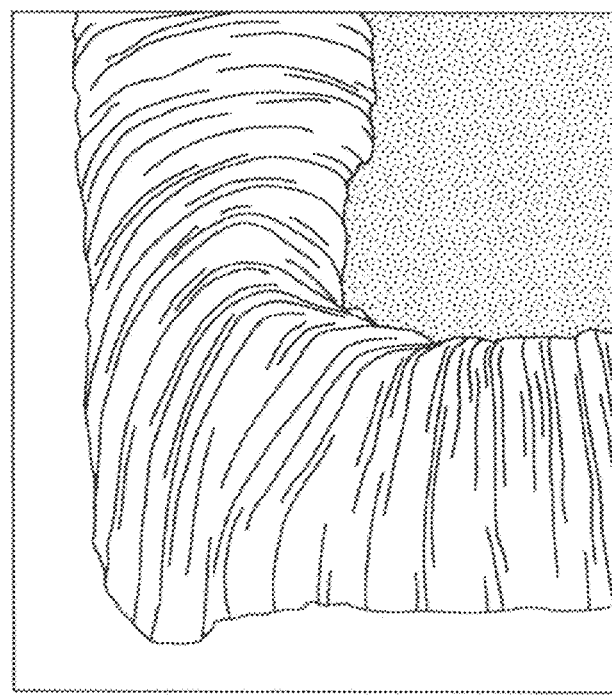
FIG. 6B is a schematic view showing the contents of the SEM photograph shown in FIG. 6A.

SEM photographs of the carbon nanotubes actually taken by the present inventors are shown in FIG. 5A and FIG. 6A. FIG. 5A is an SEM photograph showing carbon nanotubes grown from a T-shaped groove in plane view, and FIG. 5B is a schematic view showing the contents of the SEM photograph shown in FIG. 5A. FIG. 6A is an SEM photograph enlargedly shown a bent portion on the right side of FIG. 5A, and FIG. 6B is a schematic view showing the contents of the SEM photograph shown in FIG. 6A. Note that in FIG. 5A and FIG. 5B, parts of the carbon nanotubes on the left are missing. They were dropped out when handling before taking the SEM photographs, which does not deny the effect of the present invention.

Thus, it is possible to obtain the same effect as that of the first embodiment according to the second embodiment.

Third Embodiment

Figure 7A:
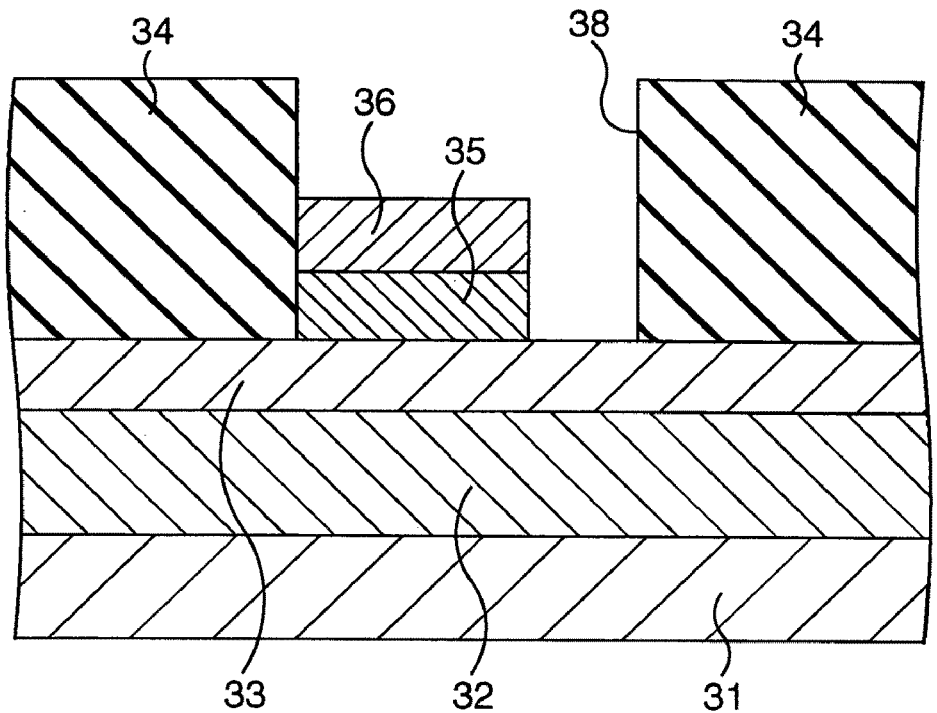
FIG. 7A and FIG. 7B are sectional views showing a manufacturing method of a carbon nanotube device according to a third embodiment of the present invention in process order.
Figure 7B:
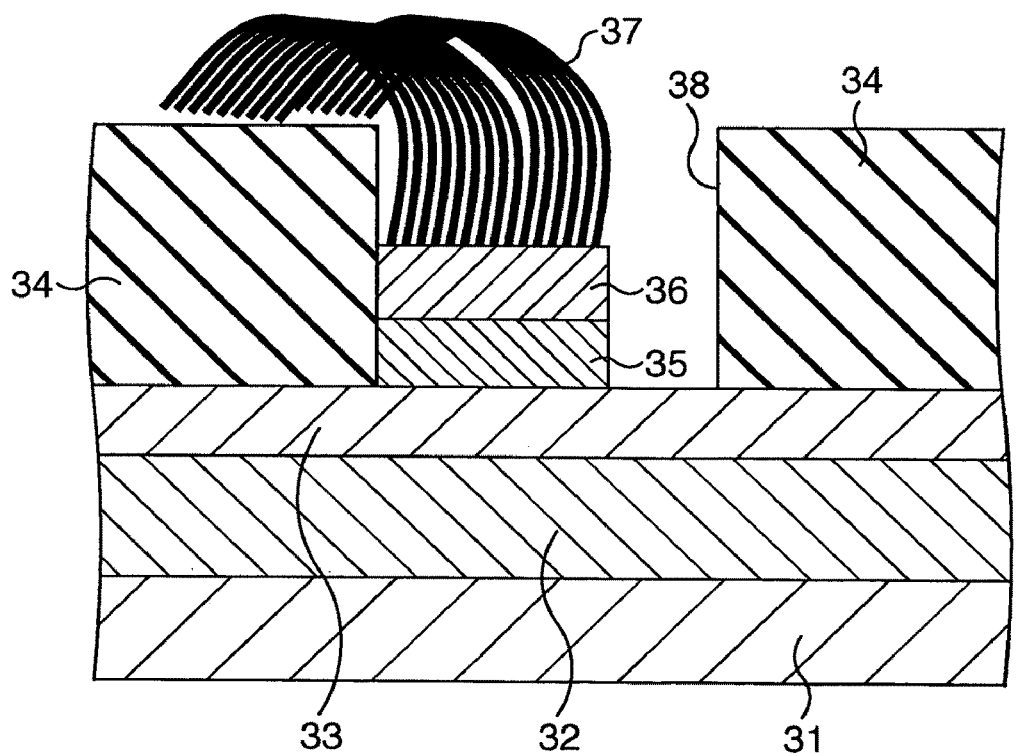

Next, a third embodiment of the present invention will be explained next. FIG. 7A to FIG. 7B are sectional views showing a manufacturing method of a carbon nanotube device according to the third embodiment of the present invention in process order.

In the third embodiment, first, as shown in FIG. 7A, a copper (Cu) film 32 and a tantalum (Ta) film 33 are formed in sequence on a Si substrate 31 by, for instance, a sputtering method. The Cu film 32 and the Ta film 33 are about 150 nm and about 5 nm in thickness, respectively. Then, a SiO$_2$ film 34 is formed over the entire surface. The SiO$_2$ film 34 is, for instance, about 350 nm in thickness. Next, a cylindrical opening 38 is formed on the SiO$_2$ film 34 by patterning with a resist pattern (not shown). The opening 38 is, for instance, about 2 μm in diameter.

Then, similarly to the first embodiment, a resist film is formed on the entire surface, and a resist pattern (not shown) is formed by patterning the resist film so that the Ta film 33 is exposed only from a part of the opening 38. When this resist pattern is formed, a part of a side surface of the SiO$_2$ film 34 is to be exposed without being covered by the resist pattern in this embodiment. Then, using the resist pattern as a mask, a titanium (Ti) film 35 and a cobalt (Co) film 36 are formed in sequence on the bottom of the opening 38. At this time, the Ti film 35 and the Co film 36 are not formed over the entire bottom of the opening 38 but only on a part where the Ta film 33 is exposed. Both the Ti film 35 and the Co film 36 are about 1 nm in thickness. After forming the Ti film 35 and the Co film 36, the resist pattern is removed.

Then, as shown in FIG. 7B, carbon nanotubes 37 are grown on the Co film 36, which is a catalytic layer. At this time, since the Co film 36 is formed biased towards one side within the opening 38 in the present embodiment, the Van der Waals force biased towards that side works horizontally on the carbon nanotubes 37 which is in the process of growing. Accordingly, as shown in FIG. 7B, the carbon nanotubes 37 are attracted to the nearest side surface of the $SiO_2$ film 34 and grow biased to that side. Thus, the shape of the carbon nanotubes 37 is largely curved similarly to the first and second embodiments.

Figure 8A:
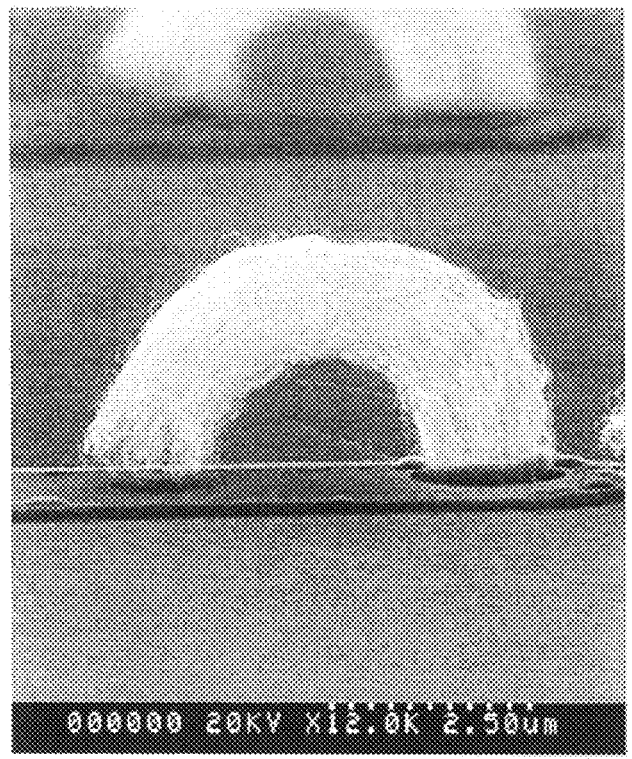
FIG. 8A is an SEM photograph showing carbon nanotubes grown from an opening.
Figure 8B:
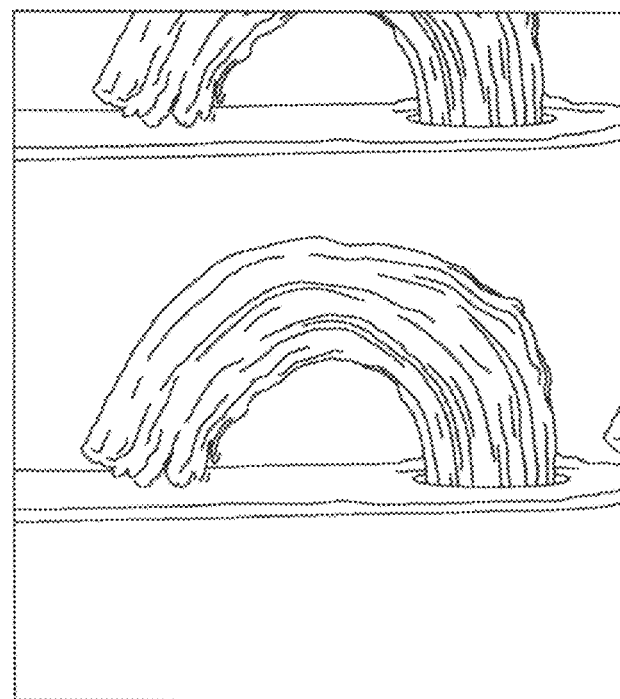
FIG. 8B is a schematic view showing the contents of the SEM photograph shown in FIG. 8A.
Figure 9A:
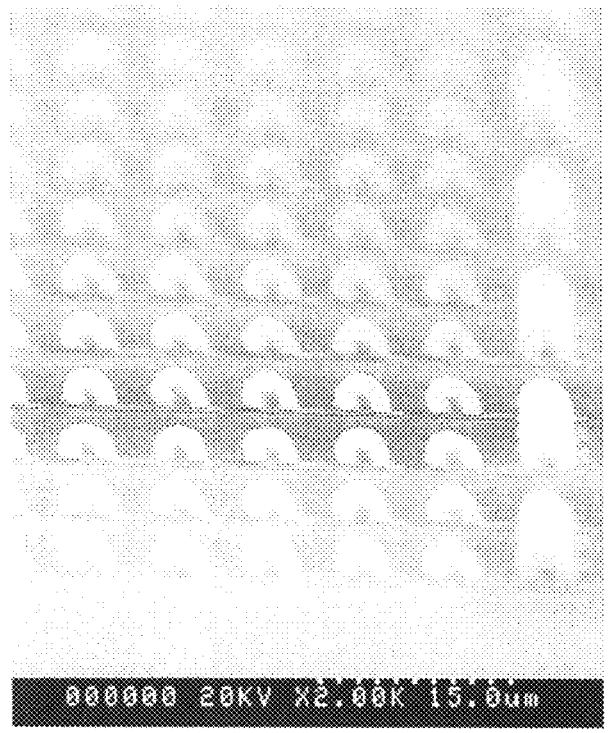
FIG. 9A is an SEM photograph showing carbon nanotubes grown from a plurality of openings.
Figure 9B:
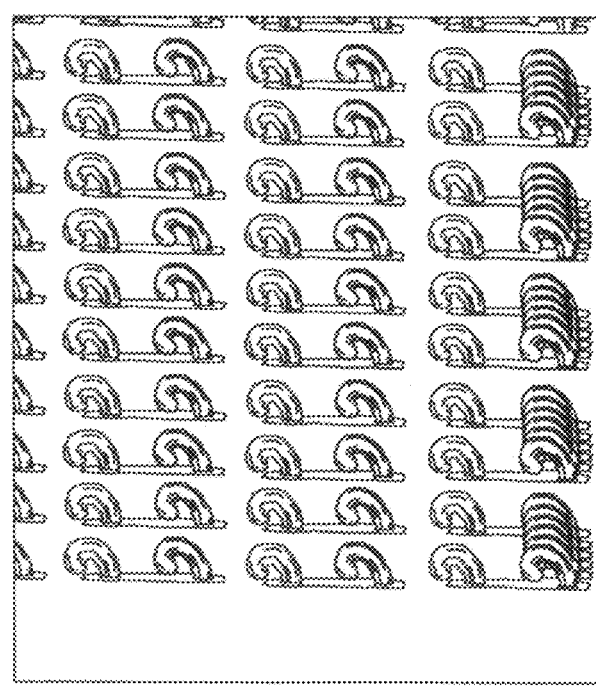
FIG. 9B is a schematic view showing the contents of the SEM photograph shown in FIG. 9A.
Figure 11A:
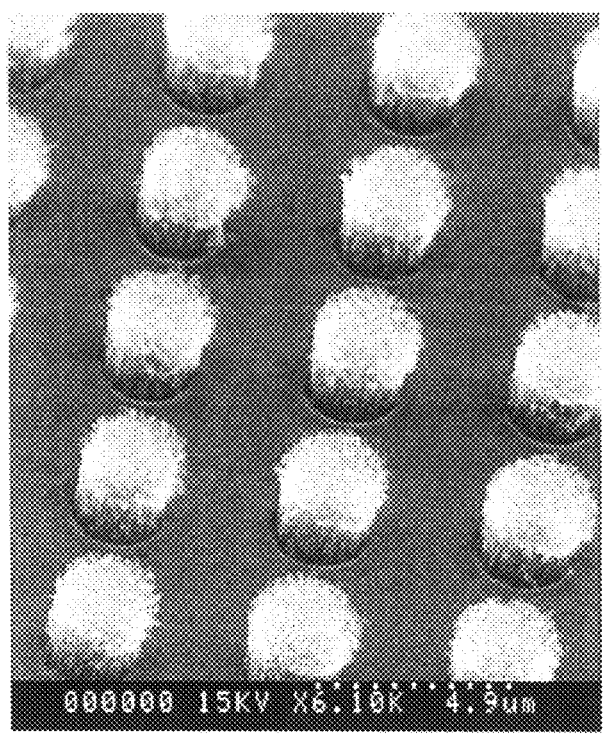
FIG. 11A is an SEM photograph of carbon nanotubes formed by a conventional method seen from above.
Figure 11B:
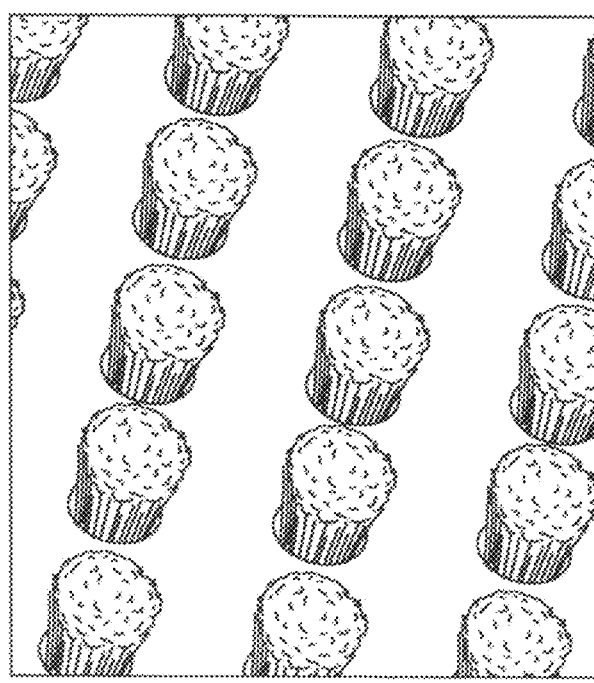
FIG. 11B is a schematic view showing the contents of the SEM photograph shown in FIG. 11A.
Figure 12A:
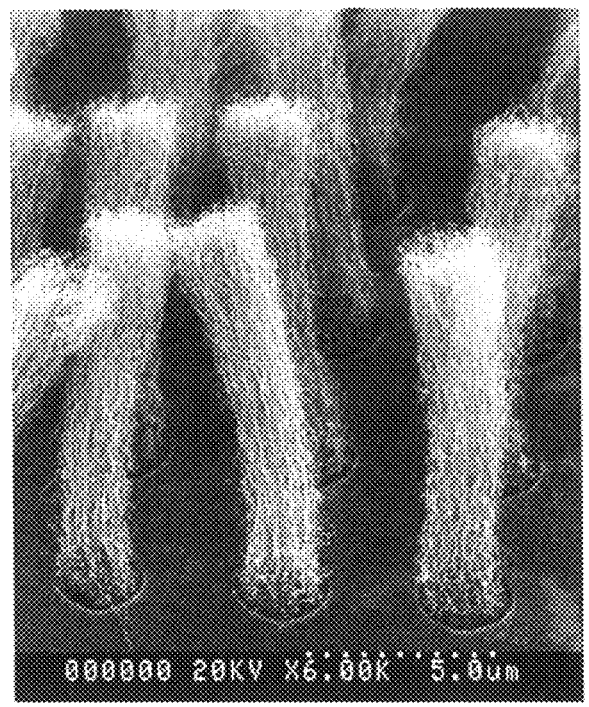
FIG. 12A is an SEM photograph of carbon nanotubes formed by a conventional method seen from side.
Figure 12B:
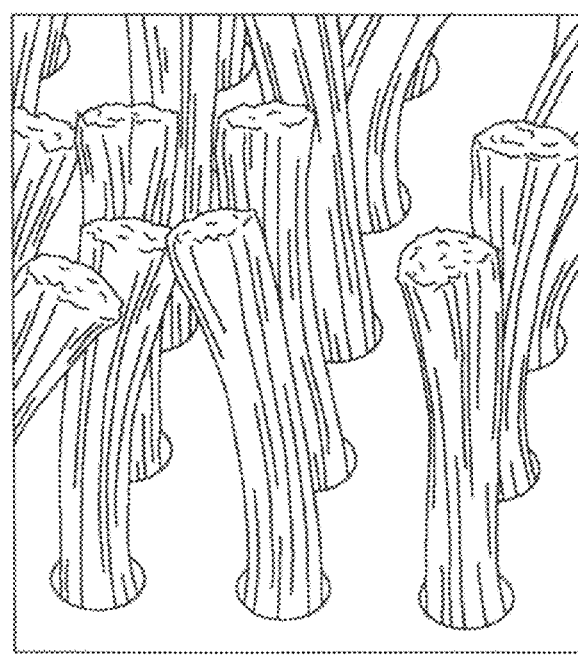
FIG. 12B is a schematic view showing the contents of the SEM photograph shown in FIG. 12A.
Figure 13:
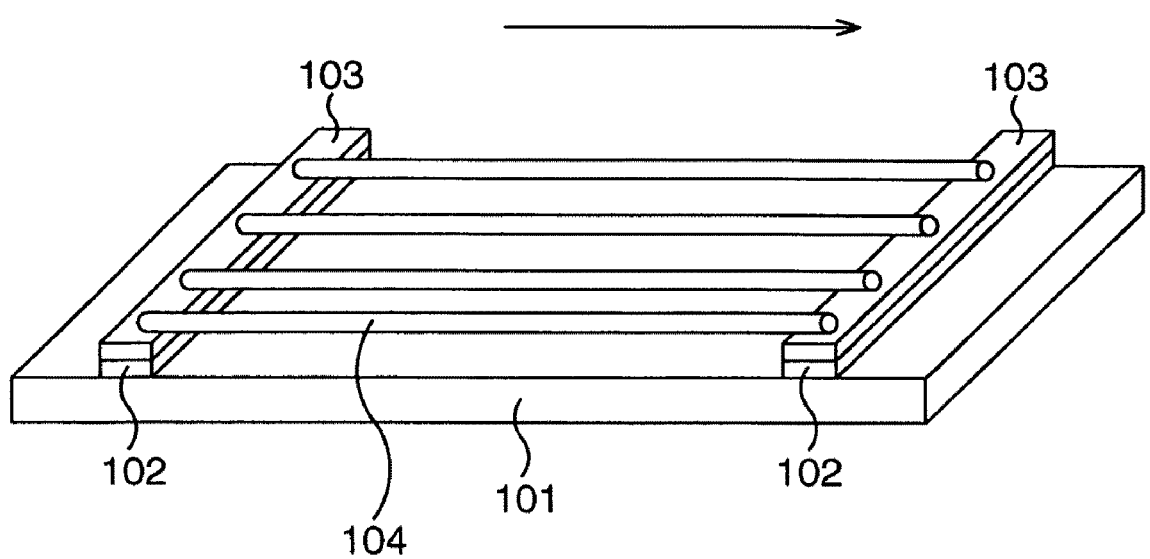
FIG. 13 is a view showing a conventional method with which carbon nanotubes are grown horizontally.

SEM photographs of the carbon nanotubes actually taken by the present inventors are shown in FIG. 8A and FIG. 9A. FIG. 8A is an SEM photograph showing carbon nanotubes grown from an opening, and FIG. 8B is a schematic view showing the contents of the SEM photograph shown in FIG. 8A. FIG. 9A is an SEM photograph showing carbon nanotubes grown from a plurality of openings, and FIG. 9B is a schematic view showing the contents of the SEM photograph shown in FIG. 9A.

It is possible to obtain the same effect as that of the first embodiment according to the third embodiment. In the third embodiment, by adjusting the thickness of the Ti film 35 and the Co film 36, the growing conditions of the carbon nanotubes 37 can be controlled.

Fourth Embodiment

Next, a fourth embodiment of the present invention will be explained. FIG. 10 is a sectional view showing a carbon nanotube device according to the fourth embodiment of the present invention.

In the fourth embodiment, a catalytic layer 55 is formed on wiring 51 buried in an insulating film 52. An insulating layer 54 is formed on the wiring 51 and the insulating film 52, and an opening reaching down to the catalytic layer 55 is formed in the insulating film 54. The catalytic layer 55 is not formed on the entire bottom of the opening, but is located biased towards one side. Wiring 57 is formed on the insulating film 54. The catalytic layer 55 and the wiring 57 are connected by carbon nanotubes 56. An insulating film 58 covering the wiring 57 and the like is formed.

In the fourth embodiment like this, the carbon nanotubes 56 grown from the catalytic layer 55 to the wiring 57 function as a part of wiring. Since the resistance of the carbon nanotubes 56 is remarkably low compared with Cu and Al wiring, it is possible to realize a device with a low power consumption.

It should be noted that these embodiments are on an assumption that curved carbon nanotubes are used inside an integrated circuit chip, it is also possible to use curved carbon nanotubes as wiring to connect an electrode of an integrated circuit chip and a lead frame. In addition, curved carbon nanotubes can be applied to an electron source, a connector, a heating device and the like.

As a catalytic layer, an iron (Fe) film or a nickel (Ni) film may be used as well as the Co film. An alloy film of these metals can also be used. Further, a body in which metal fine particles containing Co, Fe and/or Ni are carried by alumina, silica, magnesia or zeolite can be used.

Additionally, a body exerting the Van der Waals force on carbon nanotubes is not limited to an insulating film. As an insulating film, a silicon nitride film can also be used other than the above-described silicon oxide film. Furthermore, silicon-based porous low dielectric constant film, fluorocarbon-based low dielectric constant film and resin-based low dielectric constant film can also be used.

Note that it is disclosed in Patent Document 1 that a carbon nanotube can be bent by adjusting the thickness of a catalytic layer, constituent elements and the like. However, this is an impracticable method, because much trial and error is required to obtain an appropriate degree of curvature. On the other hand, in the present invention, it is possible to change the direction of the bending and the curvature of a carbon nanotube by changing at least either the thickness (height) of the silicon oxide film or the distance between the catalytic layer and the side surface of the opening. Therefore, it is easy to adjust the degree of curvature.

A carbon nanotube having a curved shape can be obtained according to the present invention. Therefore, the freedom of shape is improved and the range of application can be widened. Additionally, it is possible to grow a carbon nanotube in an arbitrary direction without applying an electric field.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A manufacturing method of a carbon nanotube device, comprising:
    forming a catalytic layer and a body extending to a position above said catalytic layer around said catalytic layer; and
    growing a carbon nanotube from said catalytic layer in the vertical direction along the sides of said body, while being bent by the effect of the Van der Waals force from said body.

2. The manufacturing method of the carbon nanotube device according to claim 1, wherein the forming said catalytic layer and said body comprises:
    forming an insulating film as said body on or above a substrate;
    forming an opening in said insulating film; and
    forming said catalytic layer on the bottom of said opening.

3. The manufacturing method of the carbon nanotube device according to claim 2, wherein said catalytic layer is formed on only one side in said opening in plane view, in the forming said catalytic layer on the bottom of said opening.

4. The manufacturing method of the carbon nanotube device according to claim 2, wherein a silicon oxide film or a silicon nitride film is formed as said insulating film.

5. The manufacturing method of the carbon nanotube device according to claim 2, wherein a low dielectric constant film is formed as said insulating film.

6. The manufacturing method of the carbon nanotube device according to claim 5, wherein the low dielectric constant film is selected from the group consisting of: a porous silicon-based film, a fluorocarbon-based film and a resin-based film.

7. The manufacturing method of the carbon nanotube device according to claim 1, wherein the forming said catalytic layer and said body comprises:

forming said catalytic layer on or above a substrate;

forming an insulating film covering said catalytic layer as said body; and forming an opening reaching down to said catalytic layer in said insulating film.

8. The manufacturing method of the carbon nanotube device according to claim 7, wherein said catalytic layer is exposed in a part of said opening, in the forming said opening.

* * * * *